United States Patent
Ko et al.

(10) Patent No.: US 12,205,844 B2
(45) Date of Patent: Jan. 21, 2025

(54) PLASMA CONTROL METHOD IN SEMICONDUCTOR WAFER FABRICATION

(71) Applicant: TAIWAN SEMICONDUCTOR MANUFACTURING COMPANY, LTD., Hsinchu (TW)

(72) Inventors: Huang-Shao Ko, Kaohsiung (TW); Jui-Fu Hsieh, Hsinchu County (TW); Chih-Teng Liao, Hsinchu (TW); Chih-Ching Cheng, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 552 days.

(21) Appl. No.: 17/225,661

(22) Filed: Apr. 8, 2021

(65) Prior Publication Data
US 2022/0328342 A1    Oct. 13, 2022

(51) Int. Cl.
| | | |
|---|---|---|
| *H01L 21/687* | (2006.01) | |
| *H01J 37/32* | (2006.01) | |
| *H01L 21/3065* | (2006.01) | |
| *H01L 21/66* | (2006.01) | |
| *H01L 21/67* | (2006.01) | |
| *H01L 21/683* | (2006.01) | |

(52) U.S. Cl.
CPC .... *H01L 21/68721* (2013.01); *H01J 37/3244* (2013.01); *H01J 37/32642* (2013.01); *H01L 21/3065* (2013.01); *H01L 21/67069* (2013.01); *H01L 21/67253* (2013.01); *H01L 21/6831* (2013.01); *H01L 22/20* (2013.01); *H01J 2237/334* (2013.01)

(58) Field of Classification Search
CPC ........... H01L 21/68721; H01L 21/3065; H01L 21/67069; H01L 21/67253; H01L 21/6831; H01L 22/20; H01L 22/26; H01L 22/12; H01L 21/31116; H01L 21/67109; H01J 37/3244; H01J 37/32642; H01J 2237/334
See application file for complete search history.

(56) References Cited

U.S. PATENT DOCUMENTS 6,210,593 B1 * 4/2001 Ohkuni ................. G01L 9/0042
    216/2
6,630,360 B2 * 10/2003 Christian ................ C25D 7/123
    257/E21.585
6,829,056 B1 * 12/2004 Barnes .............. H01L 21/67253
    118/728
6,960,416 B2 * 11/2005 Mui ........................ H01L 22/20
    430/30

(Continued)

*Primary Examiner* — Binh X Tran
*Assistant Examiner* — Christopher Remavege
(74) *Attorney, Agent, or Firm* — Birch, Stewart, Kolasch & Birch, LLP

(57) ABSTRACT

A method for processing a semiconductor wafer is provided. The method includes placing a first semiconductor wafer on a wafer chuck in a process chamber. The method further includes adjusting a distance between a gas dispenser positioned above the wafer chuck and an upper edge ring surrounding the wafer chuck. The method also includes producing a plasma for processing the first semiconductor wafer by exciting a gas dispenser from the gas dispenser after the adjustment. In addition, the method includes removing the first semiconductor wafer from the process chamber.

20 Claims, 9 Drawing Sheets

(56) References Cited

U.S. PATENT DOCUMENTS

| | | | | |
|---|---|---|---|---|
| 8,500,950 B2* | 8/2013 | Sawai | ............... | G03F 7/70641 204/298.31 |
| 8,688,256 B2* | 4/2014 | Cheng | ............... | G05B 19/41835 700/32 |
| 2002/0072240 A1* | 6/2002 | Koike | ............... | H01J 37/32642 438/710 |
| 2003/0015493 A1* | 1/2003 | Grasshoff | ......... | H01L 21/67253 216/59 |
| 2003/0116535 A1* | 6/2003 | Tsai | ............... | H01L 21/6708 257/E23.179 |
| 2004/0149389 A1* | 8/2004 | Fink | ............... | H01J 37/32642 156/345.51 |
| 2005/0071035 A1* | 3/2005 | Strang | ............... | G05B 19/41885 700/121 |
| 2006/0091108 A1* | 5/2006 | Mui | ............... | G03F 7/70625 216/41 |
| 2006/0213864 A1* | 9/2006 | Tahara | ............... | H01L 21/31138 257/E21.252 |
| 2007/0239305 A1* | 10/2007 | Zhuang | ............... | H01L 22/20 700/121 |
| 2008/0233662 A1* | 9/2008 | Shen | ............... | G05B 15/02 700/121 |
| 2009/0218317 A1* | 9/2009 | Belen | ............... | C23C 16/45565 156/345.34 |
| 2010/0040957 A1* | 2/2010 | Hiraki | ............... | G01B 15/00 702/170 |
| 2010/0314159 A1* | 12/2010 | Lee | ............... | H05K 1/0253 174/254 |
| 2011/0220609 A1* | 9/2011 | Yaegashi | ............... | H01L 21/31116 156/345.43 |
| 2012/0149133 A1* | 6/2012 | Parrish | ............... | H01L 22/20 257/E21.528 |
| 2015/0162170 A1* | 6/2015 | Kishi | ............... | H01J 37/32642 156/345.1 |
| 2015/0279749 A1* | 10/2015 | Zhang | ............... | H01L 22/12 438/14 |
| 2017/0213758 A1* | 7/2017 | Rice | ............... | H01J 37/32082 |
| 2017/0236741 A1* | 8/2017 | Angelov | ............... | H01J 37/00 29/559 |
| 2018/0053629 A1* | 2/2018 | Zhang | ............... | H01J 37/3244 |
| 2018/0277416 A1* | 9/2018 | Takahashi | ............... | H01L 21/6831 |
| 2019/0362940 A1* | 11/2019 | Zhang | ............... | H01J 37/32715 |

* cited by examiner

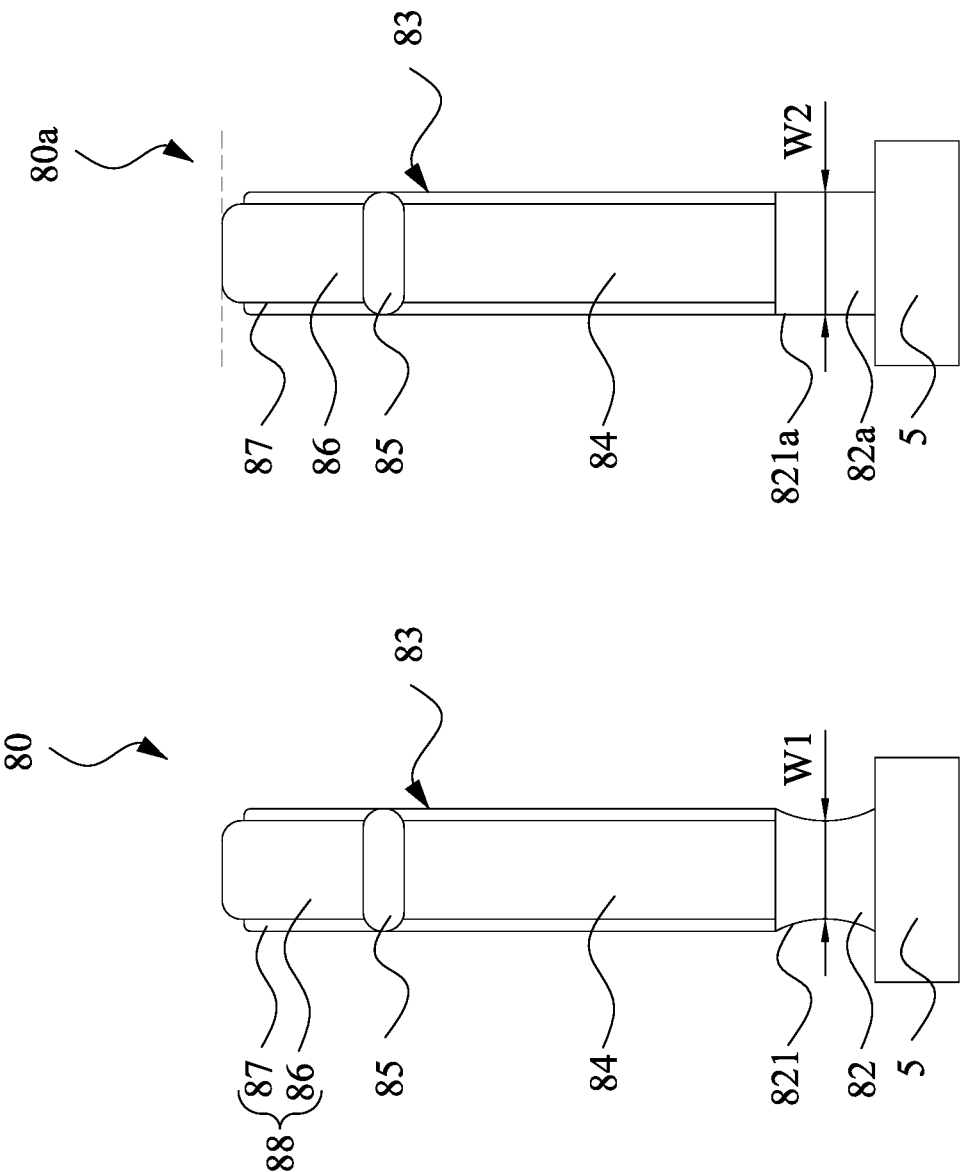

PLASMA CONTROL METHOD IN SEMICONDUCTOR WAFER FABRICATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

In the fabrication and processing of semi-conductor devices, such as silicon wafers, a variety of different semiconductor equipment and/or tools are utilized. These tools and equipment are well-known in the art, and include for example, photolithographic machines, etchers, deposition equipment, furnaces, as well as a variety of sensors and control equipment. Although the capabilities of these types of semi-conductor processing equipment have improved over the years, the technique of monitoring the ongoing process has not necessarily kept pace with the improvements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8A shows a schematic diagram of a feature formed on a semiconductor wafer as over-etching occurs, in accordance with some embodiments.

FIG. 8B shows a schematic diagram of a feature with a desired dimension formed on a semiconductor wafer, in accordance with some embodiments.

DETAILED DESCRIPTION

Figure 1:
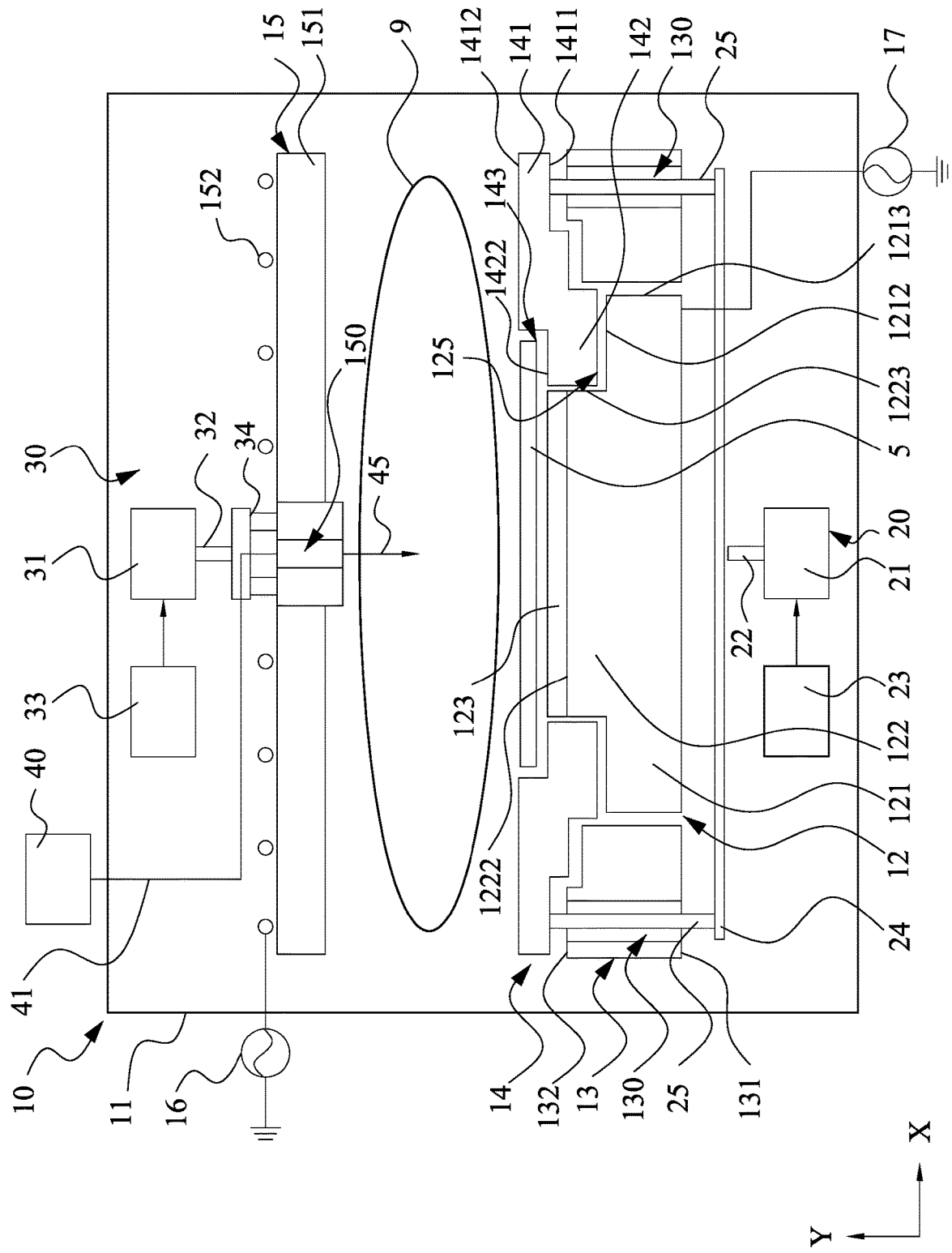
FIG. 1 shows a schematic diagram of one embodiment of a wafer fabricating system 10 for processing a semiconductor wafer 5, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device fabrication includes many different processes. One of the processes involved in manufacturing semiconductor devices is etching. A number of etching technologies may be employed, such as chemical dry etching (also called vapor phase etching) does not use liquid chemicals or etchants. This process involves a chemical reaction between etchant gases to attack the silicon surface. The chemical dry etching process is usually isotropic and exhibits high selectively. Non-uniformity of etching in the desired areas can damage device structures and reduce the chip yield in the semiconductor fabrication. For example, localized over-etching of the underlying layer is desired to be avoided. Meanwhile, the size of semiconductor wafers has gradually increased to improve throughput and reduce cost per die. For example, in the transition from 300 mm to 450 mm wafer size, the wafer area increases by 125%. The within wafer uniformity (WiWU) becomes more difficult to maintain in the more-than-double-sized wafer. To address this issue, the present disclosure provides a wafer fabricating system and method for controlling plasma in a chemical dry etching process. In one exemplary embodiment, the plasma is controlled by changing a distance between a process gas dispenser and an edge ring surrounding a wafer chuck according to a real-time monitoring process result of the semiconductor processed by the wafer fabricating system.

FIG. 1 shows a schematic diagram of one embodiment of a wafer fabricating system 10 for processing a semiconductor wafer 5, in accordance with some embodiments. The wafer fabricating system 10 in FIG. 1 includes a process chamber 11, a wafer chuck 12, a lower edge ring 13, an upper edge ring 14, a gas dispenser 15, a number of driving mechanisms, such as two driving mechanisms 20 and 30, in accordance with some embodiments.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (WIT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The wafer chuck 12 is positioned in the process chamber. In some embodiments, the wafer chuck 12 includes a lower portion 121 and an upper portion 122. The upper portion 122 is positioned on a top surface 1212 of the lower portion 121. In some embodiments, as shown in FIG. 1, the upper portion 122 has a narrower width than the lower portion 121. That is, an edge side 1223 of the upper portion 122 is distant from an edge side 1213 of the lower portion 121. In some embodiments, a heat plate 123 is positioned on a top surface 1222 of the upper portion 122. The top surface 1222 extends along a X-axis direction. The heat plate 123 may be made from an aluminum oxide or aluminum ceramic material. A heater (not shown in figures) may be mounted in the wafer chuck 12 to heat the semiconductor wafer 5. In addition, multiple gas holes (not shown in figures) may be formed on the heat plate 123 for allowing a heat conducting gas (e.g., helium gas) injecting into a gap formed between the semiconductor wafer 5 and the heat plate 123. Thermal heat form the heat plate 123 is transmitted to the semiconductor wafer 5 through the heat conducting gas.

The lower edge ring 13 is configured to support the upper edge ring 14. In some embodiments, the lower edge ring 13 surrounds the wafer chuck 12. A number of through holes 130 are formed in the lower edge ring 13. The through holes 130 extend vertically and penetrate a bottom surface 131 and a top surface 132. In some embodiments, the through holes 130 and are positioned adjacent to an outermost edge of the lower edge ring 13. The lower edge ring 13 can include any number of through holes 130. For example, there are three through holes 130 circumferentially and evenly arrange in the lower edge ring 13.

The upper edge ring 14 is configured to improve the uniformity of the plasma at an edge region of the semiconductor wafer 5. In some embodiments, the upper edge ring 14 is movably positioned on the lower edge ring 13. In some embodiments, the upper edge ring 14 includes an upper portion 141 and a lower portion 142. A portion of the lower portion 142 is located in a notch 125 formed between the edge side 1213 and the edge side 1223 and radially and outwardly protruded from the notch 125.

In some embodiments, when the upper edge ring 14 is positioned on the lower edge ring 13 and is not lift by the driving mechanism 20, a top surface 1422 of the lower portion 142 may be slight lower than a top surface of the heating plate 123 by which the wafer chuck directly face the semiconductor wafer 5. The upper portion 141 is formed on the top surface 1422 of the lower portion 142 and radially and outward extends from the lower portion 142. In some embodiments, the upper portion 141 outward extends as that an outer edge of the upper portion 141 is flush with an outer edge of the lower edge ring 13. As a result, openings of the through holes 130 that are formed on a top surface 132 of the lower edge ring 13 are covered by the upper portion 141 of the upper edge ring 14. In the other words, a vertical projection of the upper portion 141 is located on the through holes 130.

In some embodiments, the upper portion 141 is located farther away from the wafer chuck than the lower potion 142 in a radial direction of the wafer chuck 12, and a notch 143 of the upper edge ring 14 is formed at an inner side (i.e., a side of the upper edge ring 14 which is adjacent to the wafer chuck 12) the upper portion 141. The notch 143 receives an edge region of the semiconductor wafer 5, when the semiconductor wafer 5 is positioned on the wafer chuck 12. In some embodiments, when the semiconductor wafer 5 is positioned on the wafer chuck 12 and when the upper edge ring 14 is not lift by the driving mechanism 20, a top surface 1412 of the upper edge ring 14 is slightly higher than a surface of the semiconductor wafer 5 on which the plasma 9 is going to process.

While the upper portion 141 and the lower portion 142 are integrally formed as a one piece part, it is intended to be illustrative and is not intended to limit the embodiment. In some other embodiments, the upper portion 141 is movably positioned on the lower portion 142. When the driving mechanism 20 is actuated to drive a movement of the upper portion 141, the lower portion 142 is still and is not moved together with the upper portion.

The driving mechanism 20 is configured to control a height of the upper edge ring 14 relative to the wafer chuck 12. In some embodiments, the driving mechanism 20 includes an actuator 21, a connecting member 22, a plate 24 and a number of pins 25. The connecting member 22 is connected to the actuator 21. The actuator 21 may include a rotatory motor, and the connecting member 22 may include a lead screw. When the actuator 21 drives a rotation of the connecting member 22, a movement of the connecting member 22 in a Y-axis direction is actuated. The actuator 21 may be controlled by control signals transmitted from a controller 23.

In some embodiments, the plate 24 is connected to one end of the connecting member 22. The pins 25 are connected to the plate 24 and vertically extend into the through holes 130 of the lower edge ring 13. In some embodiments, the driving mechanism 20 includes three pins 25 positioned on the plate 24. The driving mechanism 20 can include any number of pins 25. For example, there are three pins 25 circumferentially and evenly arrange on the plate 24. The extension length of each of the pins 25 in the Y-axis direction may be greater than a length of each of the through holes 130 in the same direction, so that an upper ends of the pins 25 may be exposed by the through hole 130 when the pins 25 are driven upward in the Y-axis direction. In some embodiments, the driving mechanism 20 is omitted, the position of the upper edge ring 14 is fixed.

The gas dispenser 15 is configured to dispense a process gas into the chamber 11. In some embodiments, the gas dispenser 15 includes a dielectric plate 151 and a gas hole 150 formed in the dielectric plate 151. In some embodiments, the gas dispenser 15 and the dielectric plate 151 can be moved by the driving mechanism 30. The dielectric plate 151 directly faces the wafer chuck 12 and arranged along the Y-axis direction. At least one plasma coil 152 is placed adjacent to the dielectric plate 151 and is separated from the plasma 9 by the dielectric plate 151 during the operation of the wafer fabricating system 10. A source radio frequency 16 is electrically connected to the plasma coil 152 to deliver the right amount of power to the plasma coil 152. The wafer chuck 12 is also biased by a power supply 17. The power supply 17 is used to deliver the appropriate amount of power to the wafer chuck 12. The source radio frequency 16 and the power supply 17 are used to generate the plasma field for plasma generation.

The gas hole 150 is fluidly connected to a gas source 40 through a gas line 41 for dispensing the processing gas 45 into the process chamber 11. The processing gas 45 dispensed by the gas dispenser 15 may flow along Y-axis direction which is perpendicular to the X-axis. The processing gas 45 from the gas source 40 may be a fluorine-containing gas or other gas that will react with a material formed on the surface of the semiconductor wafer 5. In one embodiment, for example, the processing gas 45 comprising an etch chemistry having xenon difluoride ($XeF_2$) or hydrogen fluoride ($HF_6$), combinations of these, or the like, although any other suitable processing gas may alternatively be utilized. The gas source 40 may be a vessel, such as a gas storage tank, that is located either locally to the process chamber 11 or else may be located remotely from the process chamber 11. A controller and a valve (not show in figures) may connected to the gas line 41 to control the flow of the processing gas 45. Any suitable source for the processing gas 45 may be utilized as the gas source 40, and all such sources are fully intended to be included within the scope of the embodiments.

Figure 2:
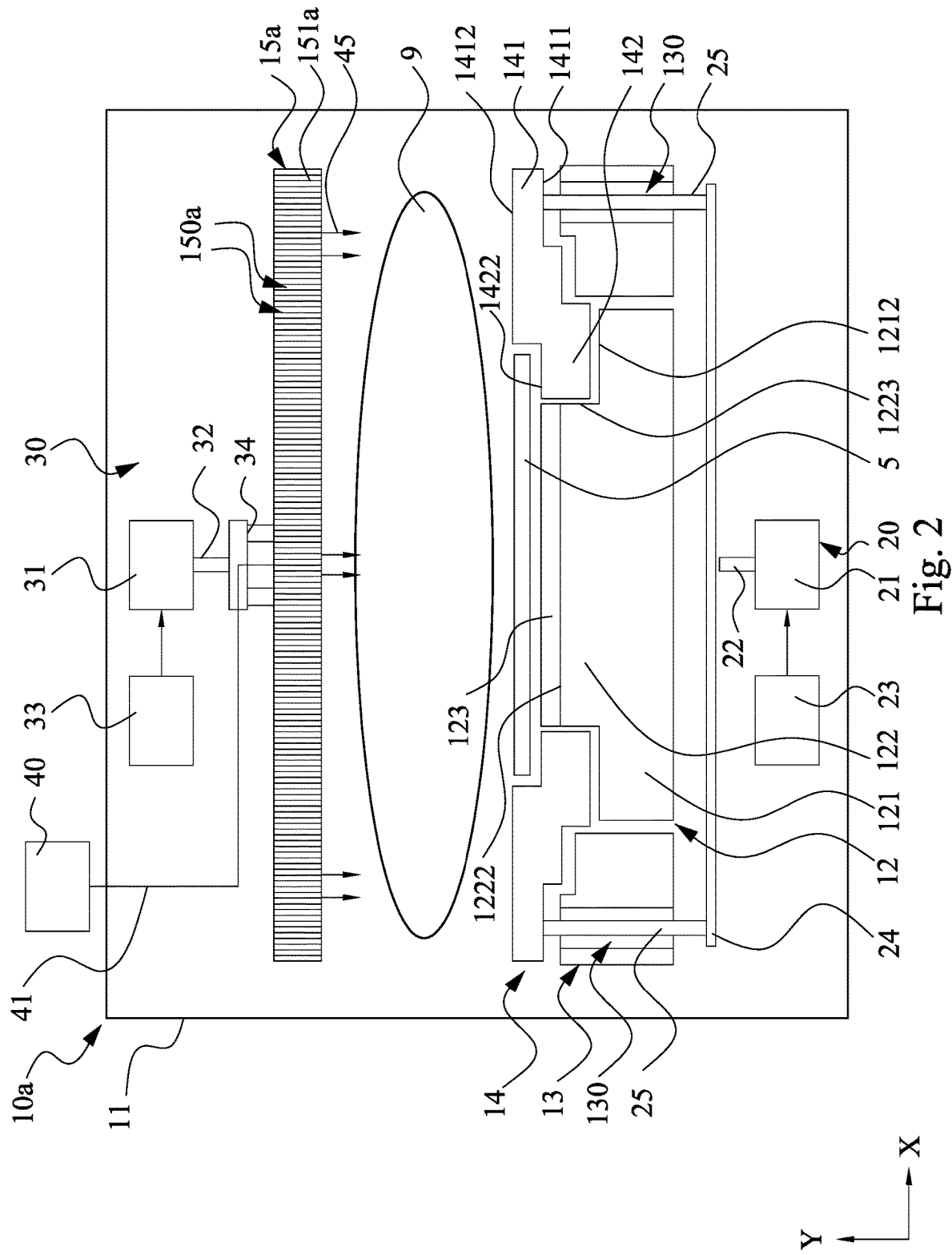
FIG. 2 shows a schematic diagram of one embodiment of a wafer fabricating system 10a for processing a semiconductor wafer 5, in accordance with some embodiments.

While there is a gas hole 150 formed in the gas dispenser 15, it is intended to be illustrative and is not intended to limit the embodiment. FIG. 2 shows a schematic diagram of one embodiment of a wafer fabricating system 10a for processing a semiconductor wafer 5, in accordance with some embodiments. In the embodiments, elements that are similar to those shown in FIG. 1 are provided with the same or similar reference numbers, and the features thereof are not reiterated in the interests of brevity. Differences between the wafer fabricating system 10a and the wafer fabricating system 10 include the gas dispenser 15 being replaced by a gas dispenser 15a. In some other embodiments, as shown in FIG. 2, the gas dispenser 15a includes a shower head 151a. The shower head 151a has a number of gas holes 150a that are adapted for providing the process gas 45 flowing from the gas source 40 to the semiconductor wafer 5 inside the process chamber 11. In some embodiments, the shower head 151a is in a circular shape.

Referring back to FIG. 1, the driving mechanism 30 is configured to control a height of the gas dispenser 15 relative to the wafer chuck 12. In some embodiments, the driving mechanism 30 includes an actuator 31, a connecting member 32, a clamping member 34. The connecting member 32 is connected to the actuator 31. The actuator 31 may include a rotatory motor, and the connecting member 32 may include a lead screw. When the actuator 31 drives a rotation of the connecting member 32, a movement of the connecting member 32 in a Y-axis direction is actuated. The actuator 31 may be controlled by control signals transmitted from a controller 33. The clamping member 34 is fixed at an end of the connecting member 32 and is clamped to the dielectric plate 151. In some embodiments, the clamping member 34 is located above the gas hole 150 and has channels (not shown in figures) for allowing the passing of the gas line 41 through the clamping member 34. In some embodiments, the driving mechanism 30 is omitted, and the height of the gas dispenser 15 is fixed.

Figure 3:
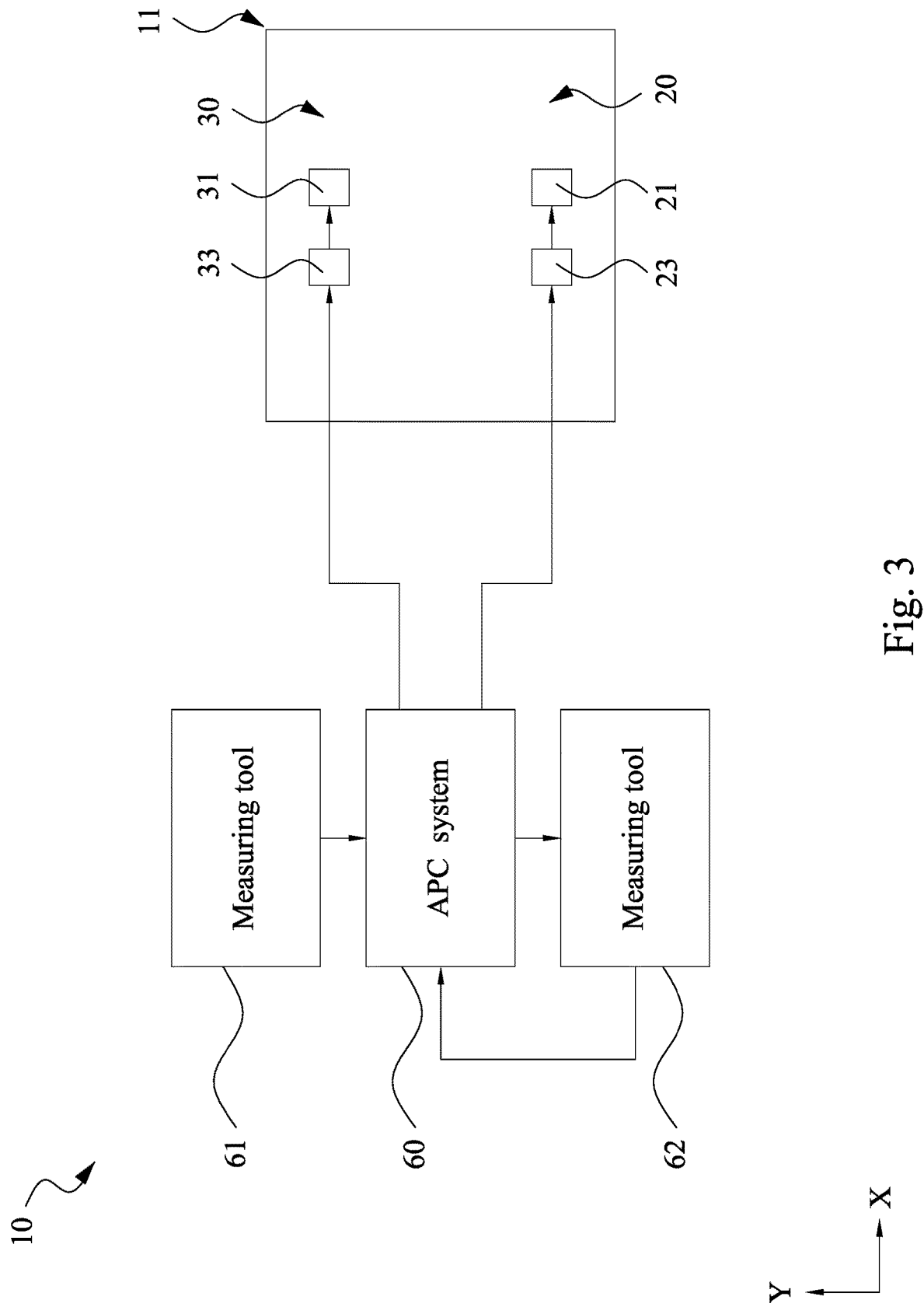
FIG. 3 shows a block diagram of the wafer fabricating system 10 in accordance with some embodiments.

FIG. 3 shows a block diagram of the wafer fabricating system 10 in accordance with some embodiments. In some embodiments, the wafer fabricating system 10 further includes an advance process control (APC) system 60 and one or more measuring tool, such as measuring tools 61 and 62. In some embodiments, the APC system 60 is electrically connected to the controller 23 of the driving mechanism 20 and the controller 33 of the driving mechanism 30 to transmit control signals based on the measurement result produced from the measuring tools 61 and 62.

In some embodiments, the measuring tools 61 and 62 are configured to measure at least one factor of the semiconductor wafer 5 processed by the process chamber 11 and removed from the process chamber 11. In some embodiments, the measuring tools 61 and 62 both include a transmission electron microscope and are configure to measure dimensions (e.g., width of a feature and/or depth of a feature) of at least one feature formed on the semiconductor wafer 5 which is processed by the process chamber 11. Data in relation to the features of the semiconductor wafer 5 is sent to the APC system 60 for analysis. The APC system 60 outputs control signals to the controller 23 and 33 based on the analysis result to control the operation of the actuators 21 and 31.

Figure 4:
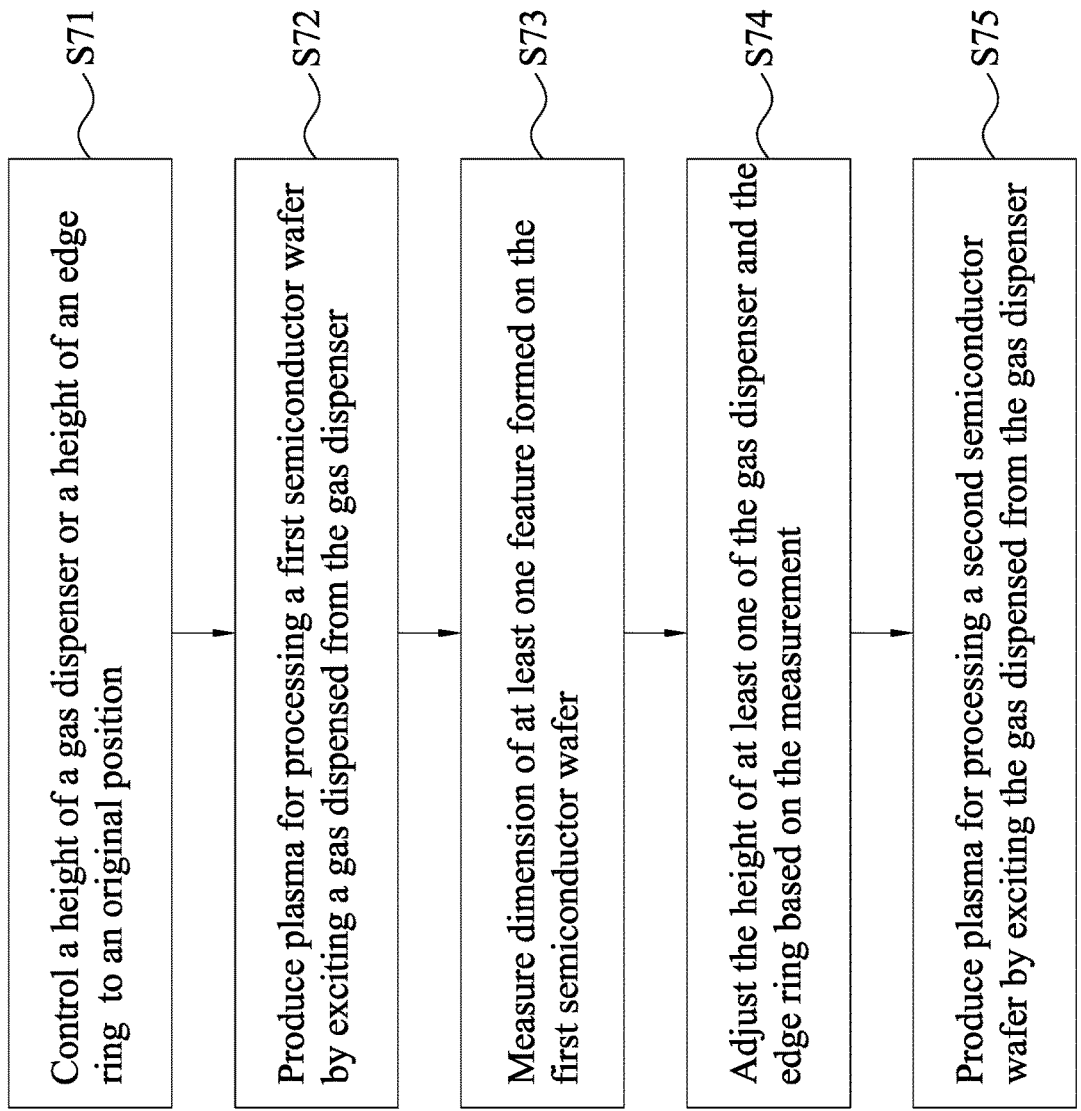
FIG. 4 is a flow chart illustrating a method S70 for processing semiconductor wafers 5, in accordance with some embodiments.

FIG. 4 is a flow chart illustrating a method S70 for processing semiconductor wafers 5, in accordance with some embodiments. For illustration, the flow chart will be described along with the drawings shown in FIGS. 5-9B. Although the method S70 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that wafer fabricating system 10 of FIG. 1 are used as examples for the method, but the method is also applicable to other structures and/or configurations, such as wafer fabricating system 10a of FIG. 2. In the following descriptions, for the purpose of illustration, the driving mechanism 20 is referred to as first driving mechanism, the driving mechanism 30 is referred to as second driving mechanism.

The method S70 include operation S71, in which one or more of a height of the gas dispenser 15 or a height of the upper edge ring 14 are controlled to move to original positions. FIG. 1 shows both the gas dispenser 15 and the upper edge ring 14 being located at its original positions. The original position of the upper edge ring 14 may be a middle point of a traveling path of the upper edge ring 14. In some embodiments, a lower end point of the traveling path of the upper edge ring 14 is at a position where the upper edge ring 14 just lies on the lower edge ring 13. A higher end point of the traveling path of the upper edge ring 14 is at a position where the top surface 1422 of the upper edge ring 14 is just in contact with a backside of the semiconductor wafer 5. The original position of the gas dispenser 15 may be a middle point of a traveling path of gas dispenser 15. In some embodiments, the traveling path of the gas dispenser 15 has a longer distance than the traveling path of the upper edge ring 14. In one exemplary embodiment, the distance of the traveling path of the gas dispenser 15 is in a range from about 5 mm to about 10 mm, and the distance of the traveling path of the upper edge ring 14 is in a range from about 2 mm to 5 mm.

The method S70 include operation S72, in which a plasma for processing a semiconductor wafer 5 is produced by exciting a processing gas 45 dispensed from the gas dispenser 15. In some embodiments, before operation S72, the semiconductor wafer 5 may be placed on the wafer chuck 12. The transport of semiconductor wafer 5 may be performed before operation S71 or after operation S71. In some embodiments, as shown in FIG. 1, the processing gas 45 supplied from the gas source 40 is dispensed into the process chamber 11 through the gas hole 150 formed on the gas dispenser 15. The processing gas 45 in the process chamber 11 is then excited by the plasma field produced between the plasma coil 152 and the wafer chuck 12. The plasma may be used for implementing an etching process over the semiconductor wafer 5 so as to remove a thin film, to trim a sidewall of a feature or to form a recess.

The method S70 include operation S73, in which at least one dimension of a feature formed on the semiconductor wafer 5 is measured. In some embodiments, after the etching process is completed, the semiconductor wafer 5 is removed from the process chamber 11 and sent to the measuring tool 61. In the measure tool 61, at least one feature formed on the semiconductor wafer 5 is measure, and data in relation to the measuring result is sent to the APC system 60 for analysis.

FIG. 8A shows a schematic view of a feature 80 formed on the semiconductor wafer 5. In some embodiments, the feature 80 is partial element of a Fin FET device and includes an isolation insulating layer 82 and a gate structure 83 formed on the semiconductor wafer 5. In some embodiments, operation S72 is performed to remove the isolation insulating layer 82 after the formation of the gate structure 83, and operation S73 is performed to measure a width W1 of the isolation insulating layer 82 under the gate structure 83. In some embodiments, the isolation insulating layer 82 includes one or more layers of insulating materials such as silicon oxide, silicon oxynitride or silicon nitride, formed by LPCVD (low pressure chemical vapor deposition), plasma-CVD or flowable CVD. The gate structure 83 is formed on the isolation insulating layer 82 and includes gate electrode layer 84 and a hard mask 88. The gate electrode layer 84 may comprise a single layer or multilayer structure. The gate electrode layer 84 may be doped poly-silicon with uniform or non-uniform doping. The gate electrode layer 84 may be formed using a suitable process such as ALD, CVD, PVD, plating, or combinations thereof. The hard mask 88 is formed for protecting the gate electrode layer 84. The hard mask 88 may include a first layer 85 and a second layer 86. The first layer 85 may be silicon nitride and the second layer 86 may be oxide layer. Alternatively, the first layer 85 may be silicon oxide and the second layer 86 may be silicon nitride. An insolation layer 87 is formed on a side wall of the gate structure 83 to protect the gate structure 83 during the etching process.

However, it will be appreciated that many variations and modifications can be made to embodiments of the disclosure. FIG. 9A shows a schematic view of a feature including a recess 95 formed on the semiconductor wafer 5. In some embodiments, operation S72 is performed to recess the semiconductor wafer 5, and operation S73 is performed to measure a depth d1 of the recess 95.

In some embodiments, more than one feature on the semiconductor wafer 5 is measured in operation S73. For example, two features which are respectively formed in a central region of the semiconductor wafer 5 and formed in an edge region of the semiconductor wafer 5 are measured. The feature in the central region and the feature in the edge region of the semiconductor wafer 5 have same configuration but may have different dimensions due to non-uniformity of etching. In the discussion herein, the central region of the semiconductor wafer 5 is defined as a circular area with a radius of 50-80% of the semiconductor wafer 5 radius and centered on the center of the semiconductor wafer 5, and the edge region of the semiconductor wafer 5 is defined as a ring area that connects the circular area to an edge of the semiconductor wafer 5.

In some embodiments, the measuring tool 61 sends an image in relation to features formed on the semiconductor wafer 5 to the APC system 60 for analysis. In some embodiments, the APC system 60 executes an image analysis to calculate a difference between desired dimensions and actual dimensions of the features, and the APC system 60 may group the results into three categories including "over-etching", "standard" and "under-etching." The category "over-etching" means the etching process performed in the process chamber 11 removes too much target material. For example, in some instances as shown in FIGS. 8A and 8B, a width W1 of the isolation insulating layer 82 is significantly less than a width W2 of the isolation insulating layer 82a, i.e., a desired pattern, and the image in relation to the feature 80 is categorized to "over-etching." In contrast, the isolation insulating layer of a processed feature has a substantially equal width (or width within an acceptable range) as the isolation insulating layer 82a is categorized to "standard", and the isolation insulating layer of a processed feature has a greater width than the isolation insulating layer 82a is categorized to "under-etching." In some embodiments, the categories of "over-etching" and "under-etching" are not acceptable in the fabrication of semiconductor wafer 5.

Figure 9B:
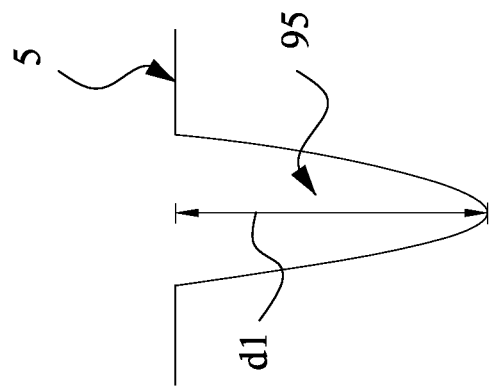
FIG. 9B shows a schematic diagram of a feature with a desired dimension formed on a semiconductor wafer, in accordance with some embodiments.
Figure 9A:
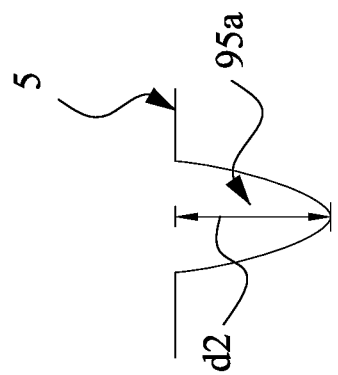
FIG. 9A shows a schematic diagram of a feature formed on a semiconductor wafer as over-etching occurs, in accordance with some embodiments.

In some other instances as shown in FIGS. 9A and 9B, a depth d1 of the recess 95 is significantly greater than a depth d2 of a recess 95a, i.e., a desired pattern, and the image in relation to the recess 95 is categorized to "over-etching." In contrast, the recess formed on a semiconductor wafer has a substantially equal depth as the recess 95a is categorized to "standard", and the recess formed on a processed semiconductor wafer has a less depth than the recess 95a is categorized to "under-etching."

In some embodiments, the APC system 60 calculates a difference between dimensions of a feature processed by the process chamber 11 and dimensions of a desired pattern. For example, in some instances as shown in FIGS. 8A and 8B, a difference between the width W1 of the isolation insulating layer 82 and the width W2 of the isolation insulating layer 82a is calculated by the APC system 60. In some other instances as shown in FIGS. 9A and 9B, a difference between the depth d1 of the recess 95 and the depth d2 of the recess 95a is calculated by the APC system 60.

The method S70 include operation S74, in which one or more of the height of the upper edge ring 14 or the height of the gas dispenser 15 are adjusted to change a distance between the upper edge ring 14 and the gas dispenser 15 based on the measurement result executed in operation S73. In some embodiments, factors for determining which of the upper edge ring 14 and gas dispenser 15 is going to be moved include where the feature categorized to "under-etching" or "over-etching" is located. Multiple examples are presented in the following.

In cases where the features categorized to "under-etching" or "over-etching" is located in a central region of the semiconductor wafer 5, the height of the gas dispenser 15 is moved to adjust plasma produced in the process chamber 11 and therefore features formed in the central region of the semiconductor wafer 5 are etched by the plasma with different etching rates. For example, when the feature categorized to "under-etching" is located in the central region of the semiconductor wafer 5, the height of the gas dispenser 15 is adjusted by the second driving mechanism 30 toward the semiconductor wafer 5 along direction as indicated by arrow A1 shown in FIG. 5. As a result, the shape of the plasma 9b becomes flatter in comparison to the plasma 9 which means a portion of the plasma 9b reacting with the central region of the semiconductor wafer 5 exhibits a higher plasma density after the downward movement of the gas dispenser 15. In contrary, when the feature categorized to "over-etching" is located in the central region of the semiconductor wafer 5, the height of the gas dispenser 15 is adjusted by the second driving mechanism 30 away the semiconductor wafer 5. As a result, the shape of the plasma becomes elevated in comparison to the plasma 9 which means a portion of the plasma reacting with the central region of the semiconductor wafer 5 exhibits a lower plasma density after the upward movement of the gas dispenser 15.

In cases where the features categorized to "under-etching" or "over-etching" is located in an edge region of the semiconductor wafer 5, the height of the upper edge ring 14 is moved to adjust plasma produced in the process chamber 11 and therefore features formed in the edge region of the semiconductor wafer 5 are etched by the plasma with different etching rates. For example, when the feature categorized to "under-etching" is located in the edge region of the semiconductor wafer 5, the height of the upper edge ring 14 is adjusted by the first driving mechanism 20 toward the gas dispenser 15 along direction as indicated by arrow A2 shown in FIG. 6. As a result, the shape of the plasma 9c becomes narrower in comparison to the plasma 9 which means a portion of the plasma 9c reacting with the edge region of the semiconductor wafer 5 exhibits a higher plasma density after the upward movement of the upper edge ring 14. In contrary, when the feature categorized to "over-etching" is located in the edge region of the semiconductor wafer 5, the height of the upper edge ring 14 is adjusted by the second driving mechanism 30 away the gas dispenser 15. As a result, the shape of the plasma becomes wider in comparison to the plasma 9 which means a portion of the plasma reacting with the edge region of the semiconductor wafer 5 exhibits a lower plasma density after the downward movement of the upper edge ring 14.

In cases where the features categorized to "under-etching" or "over-etching" is located in both the central region and the edge region of the semiconductor wafer 5, the height of the upper edge ring 14 and the height of the gas dispenser 15 are moved to adjust plasma produced in the process chamber 11 and therefore features formed in the central region and the edge region of the semiconductor wafer 5 are etched by the plasma with different etching rates. For example, when the features categorized to "under-etching" are located in both the central region and the edge region of the semiconductor wafer 5, the height of the upper edge ring 14 and the height of the gas dispenser 15 are adjusted simultaneously or sequentially. The height of the gas dispenser 15 is adjusted by the second driving mechanism 30 toward the semiconductor wafer 5 along direction as indicated by arrow A1 shown in FIG. 7, and the height of the upper edge ring 14 is adjusted by the first driving mechanism 20 toward the gas dispenser 15 along direction as indicated by arrow A2 shown in FIG. 7. As a result, the shape of the plasma 9d becomes narrower and flatter in comparison to the plasma 9 which means portions of the plasma 9d reacting with the central region and the edge region of the semiconductor wafer 5 exhibit a higher plasma density after the movement of the upper edge ring 14 and the gas dispenser 15.

Figure 5:
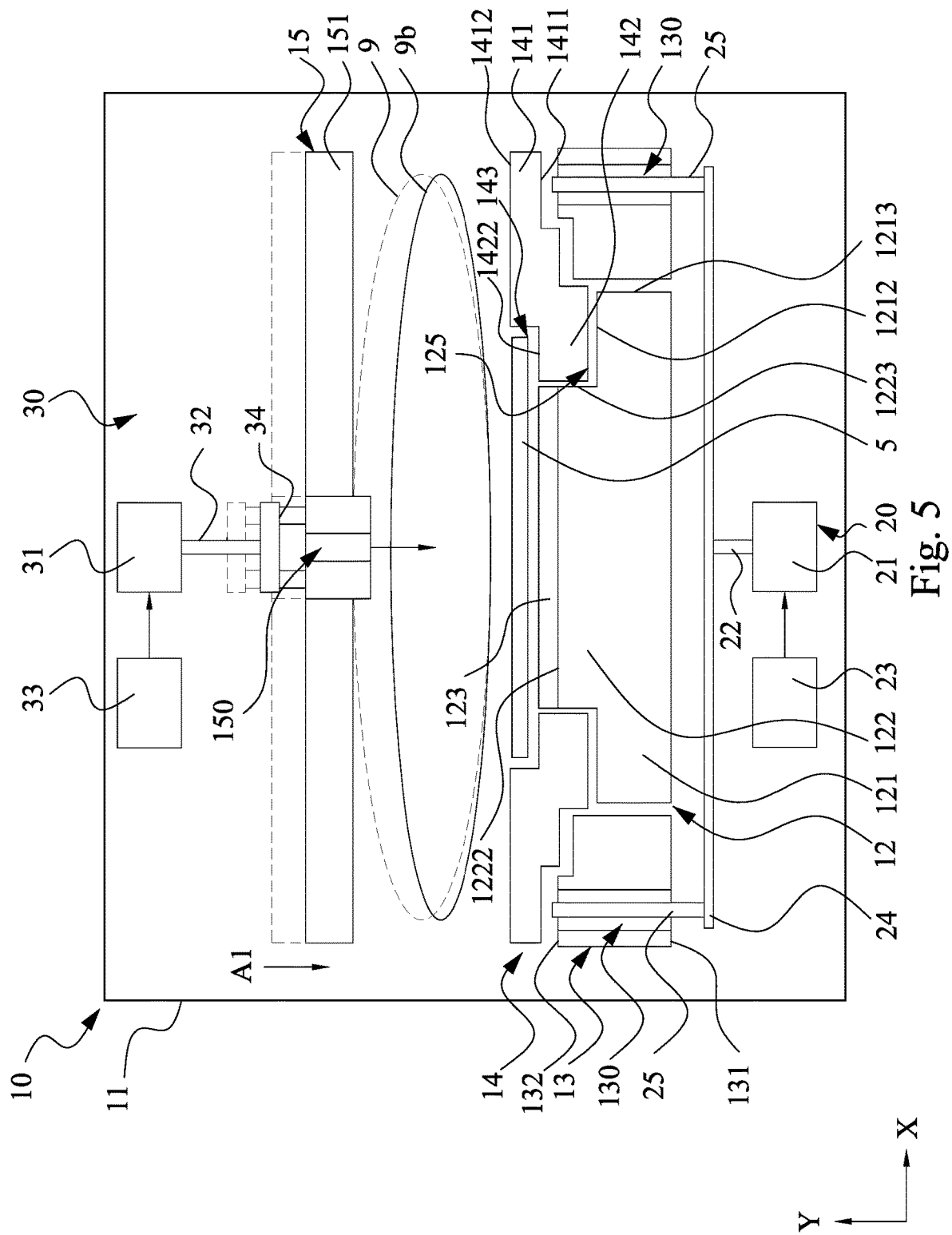
FIG. 5 shows a schematic diagram of one stage of a method for processing semiconductor wafers as a gas dispenser is moved downward, in accordance with some embodiments.
Figure 6:
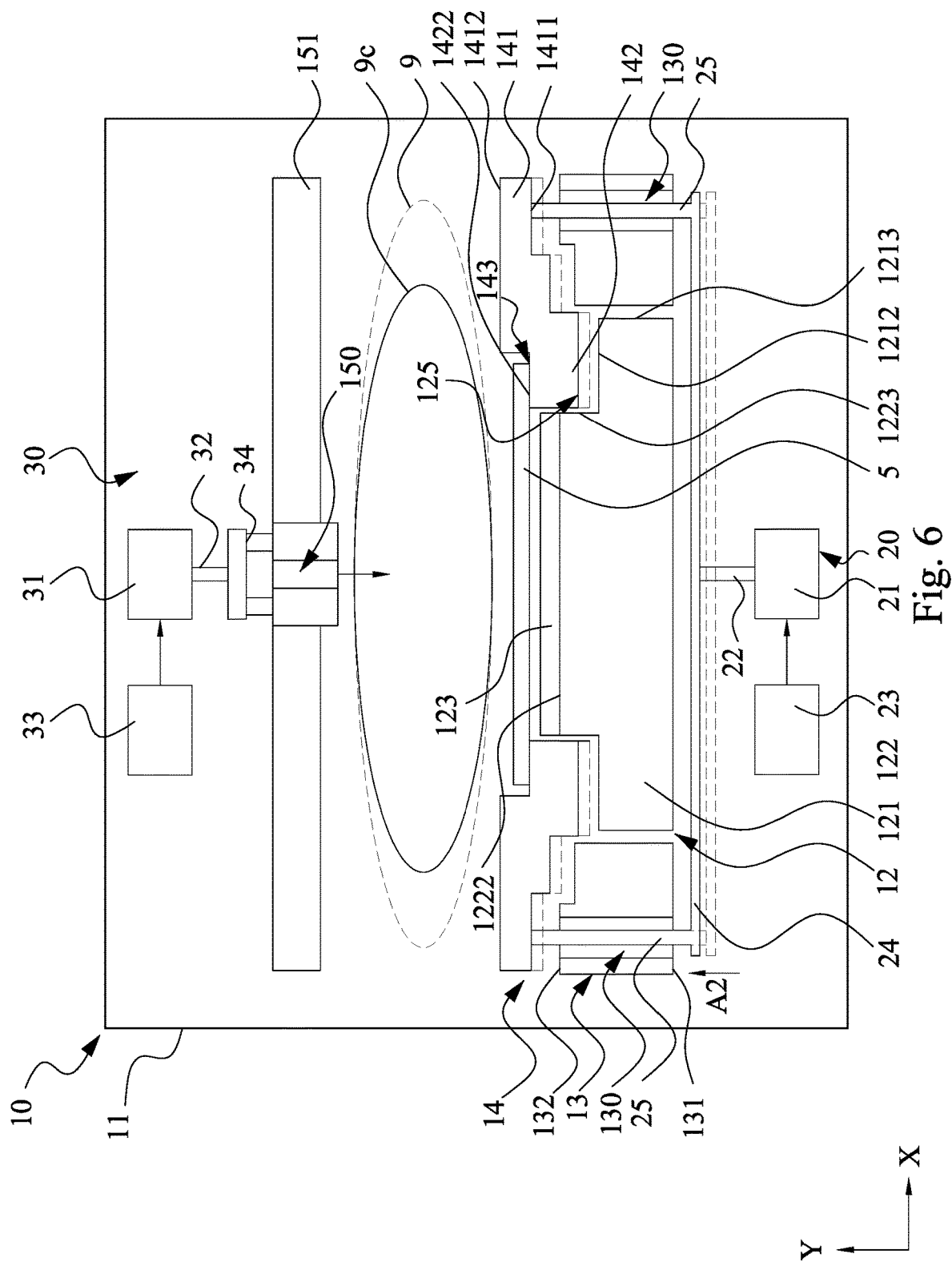
FIG. 6 shows a schematic diagram of one stage of a method for processing semiconductor wafers as an upper edge ring is moved upward, in accordance with some embodiments.
Figure 7:
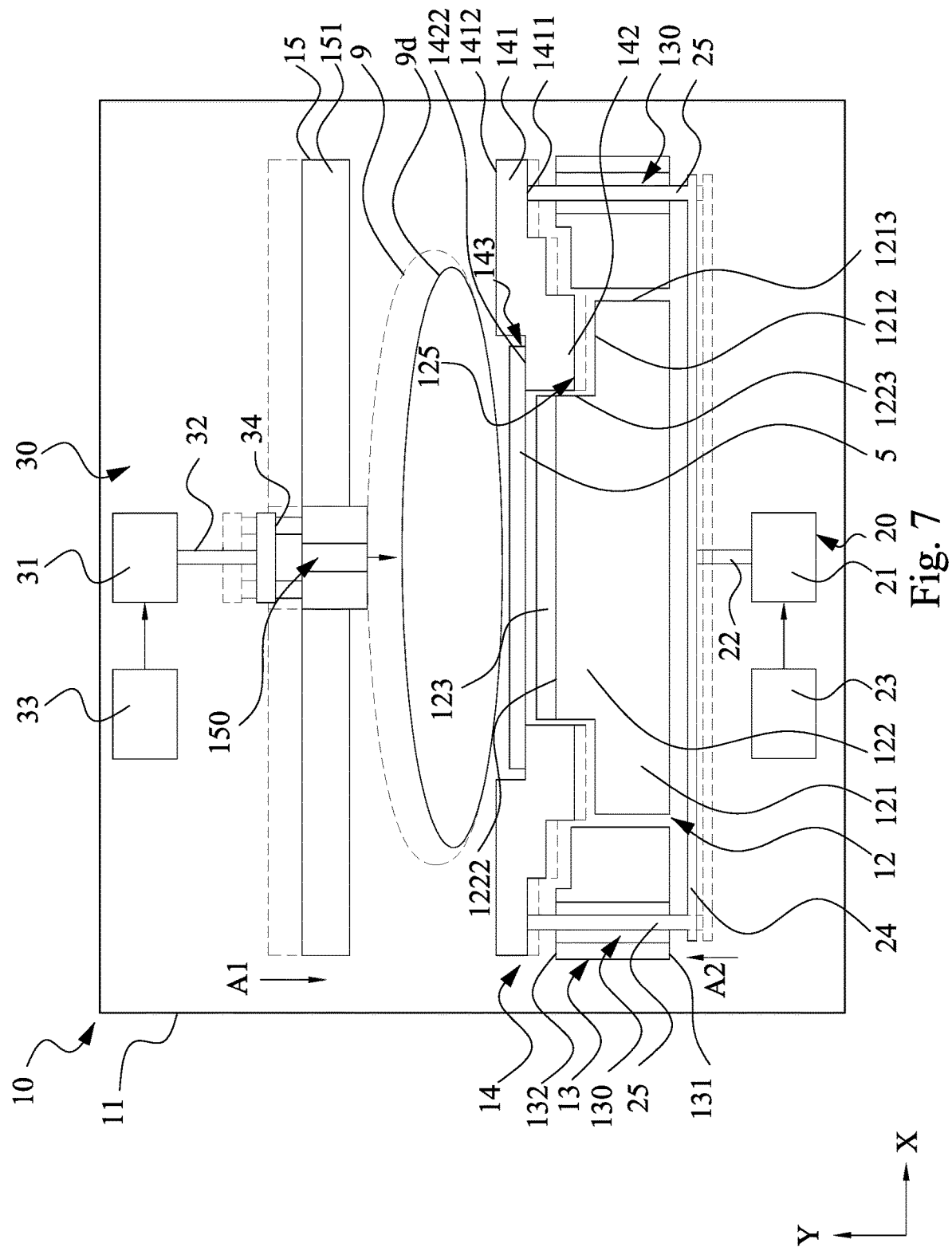
FIG. 7 shows a schematic diagram of one stage of a method for processing semiconductor wafers as a gas dispenser is moved downward and an upper edge ring is moved upward, in accordance with some embodiments.

It will be noted that, in the embodiments shown in FIGS. 5-7, the ellipse regions designated with reference numerals 9, 9b, 9c and 9d illustrate contours of plasma having a plasma density greater than a predetermined value. The predetermined value may be a lowest plasma density that is capable to exhibit a preset etching rate. Plasma may be generated outside the ellipse regions but may not be used for processing the semiconductor wafer 5.

In some embodiments, the moving distances of the upper edge ring 14 and the moving distance of the gas dispenser 15 are determined based on a difference between dimensions of a feature processed by the process chamber 11 and dimensions of a desired pattern. The difference in dimensions may be calculated by the APC system 60, and a lookup table may be utilized to determine a moving distance according to the difference in dimensions so as to improve uniformity of etching in a later process performed by the process chamber 11.

The method S70 also includes operation S75, in which a plasma is produced for processing another semiconductor wafer 5 (second semiconductor) by exciting the gas dispenser from the gas dispenser. In some embodiments, operation S75 is performed after operation S74 is completed and after another semiconductor wafer 5 is placed on the wafer chuck 12 in the process chamber 11. In some embodiments, since the uniformity of etching is improved by adjusting the position of the upper edge ring 14 and the positon of the gas dispenser 15, features formed on the semiconductor wafer 5 are etched by suitable plasma, and die to die uniformity for critical dimension is significantly improved.

In some embodiments, another height adjustment of the upper edge ring 14 and the gas dispenser 15 is performed by repeating operations S73 and S74 after operation S75 is completed so as to continuously optimize the plasma distribution. Operation S73 for another semiconductor wafer may be performed in different measuring tool 62 (FIG. 3). However, it will be appreciated that many variations and modifications can be made to embodiments of the disclosure. Operation S73 may be performed in the same measuring tool 61 as the previous processed semiconductor wafer.

Embodiments of wafer fabrication system control plasma by adjusting a height of the gas dispenser and/or a height of the upper edge ring in the process chamber. The movement of the gas dispenser and the upper edge ring is determined by a process result learned from inspecting a previously processed semiconductor wafer. Since critical dimensions of the next processed semiconductor wafer can be properly controlled, a better uniformity in dimension of features on each semiconductor wafer (e.g. from the center of the semiconductor wafer to the edges thereof) and from wafer-to-wafer in a batch of semiconductor wafers are improved.

In accordance with some embodiments, a method for processing a semiconductor wafer is provided. The method includes placing a first semiconductor wafer on a wafer chuck in a process chamber. The method further includes adjusting a distance between a gas dispenser positioned above the wafer chuck and an upper edge ring surrounding the wafer chuck. The method also includes producing a plasma for processing the first semiconductor wafer by exciting a gas dispenser from the gas dispenser after the adjustment. In addition, the method includes removing the first semiconductor wafer from the process chamber.

In accordance with some embodiments, a method for processing a semiconductor wafer is provided. The method includes placing a semiconductor wafer on a wafer chuck in a process chamber, wherein the wafer chuck has a top surface expanding in a first direction. The method further includes dispensing a processing gas through a gas dispenser, wherein the gas dispenser is positioned above the wafer chuck in a second direction. The method also includes producing a plasma for processing the second semiconductor wafer by exciting the processing gas. In addition, the method includes controlling a shape of the plasma in the second direction by adjusting a height of the gas dispenser.

In accordance with some embodiments, a system for processing a semiconductor wafer is provided. The system includes a wafer chuck and an upper edge ring surrounding the wafer chuck. The system also includes a gas dispenser positioned above the wafer chuck. The system further includes a gas source fluidly communicating with the gas dispenser. In addition, the system includes a first driving mechanism connected to one of the upper edge ring or the gas dispenser to vertically move the upper edge ring or the gas dispenser.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
placing a first semiconductor wafer on a wafer chuck in a process chamber;
producing a first plasma for processing the first semiconductor wafer by exciting a first gas from a gas dispenser, such that a first feature is formed on a central region of the first semiconductor wafer and a second feature is formed on an edge region of the first semiconductor wafer, wherein the central region of the first semiconductor wafer has a circular area, and the edge region of the first semiconductor wafer has a ring area surrounding the central region, and the gas dispenser is positioned above the wafer chuck;
removing the first semiconductor wafer from the process chamber;
placing a second semiconductor wafer into the process chamber;

measuring a first dimension of the first feature, and measuring a second dimension of the second feature;
calculating a first difference between the first dimension of the first feature and a first predetermined dimension through a process control system, and calculating a second difference between the second dimension of the second feature and a second predetermined dimension through the process control system;
determining whether the first difference is acceptable through the process control system, and determining whether the second difference is acceptable through the process control system;
in response to the determination determines that the first difference of the central region of the first semiconductor wafer is not acceptable, adjusting a first vertical distance between the gas dispenser and the wafer chuck;
in response to the determination determines that the second difference of the edge region of the first semiconductor wafer is not acceptable, adjusting a second vertical distance between an upper edge ring surrounding the wafer chuck and the gas dispenser; and
after adjusting the first and second vertical distances, producing a second plasma for processing the second semiconductor wafer by exciting a second gas from the gas dispenser.

2. The method of claim 1, wherein when an under-etching occurs to the first feature on the central region of the first semiconductor wafer, decreasing the first vertical distance between the gas dispenser and the wafer chuck.

3. The method of claim 1, wherein when an under-etching occurs to the first feature on the edge region of the first semiconductor wafer, decreasing the second vertical distance between the upper edge ring and the gas dispenser.

4. The method of claim 1, wherein the adjustment of the second vertical distance between the gas dispenser and the upper edge ring is performed by controlling a height of the upper edge ring with a pin passing through an outer edge ring that is positioned below the upper edge ring and surrounds the wafer chuck.

5. The method of claim 1, wherein the adjustment of the second vertical distance between the gas dispenser and the upper edge ring is performed by controlling a height of the gas dispenser and a height of the upper edge ring.

6. A method, comprising:
placing a first semiconductor wafer above a top surface of a wafer chuck in a process chamber, wherein the top surface extends in a horizontal direction;
dispensing a processing gas through a gas dispenser, wherein the gas dispenser is positioned above the wafer chuck in a vertical direction;
producing a plasma for processing the first semiconductor wafer by exciting the processing gas, such that a first feature is formed on a central region of the first semiconductor wafer, and a second feature is formed on an edge region of the first semiconductor wafer;
measuring a first dimension of the first feature, measuring a second dimension of the second feature;
calculating a first_difference between the first dimension of the first feature, formed through the process chamber, and a first predetermined dimension through a process control system, and calculating a second difference between the second dimension of the second feature, formed through the process chamber, and a second predetermined dimension through the process control system;

determining whether the first difference is acceptable through the process control system, and determining whether the second difference is acceptable through the process control system;

placing a second semiconductor wafer into the process chamber;

in response to the determination determines that the first difference of the central region of the first semiconductor wafer is not acceptable, controlling a shape of the plasma in the vertical direction by adjusting a first vertical distance between the gas dispenser and the wafer chuck; and in response to the determination determines that the second difference of the edge region of the first semiconductor wafer is not acceptable, controlling the shape of the plasma in the vertical direction by adjusting a second vertical distance between an upper edge ring surrounding the wafer chuck and the gas dispenser.

7. The method of claim 6, wherein adjusting the second vertical distance between the upper edge ring and the gas dispenser comprises adjusting a height of the upper edge ring to control a width of the plasma in the horizontal direction.

8. The method of claim 6, wherein when an under-etching occurs to the second feature, adjusting the second vertical distance between the upper edge ring and the gas dispenser comprises lowering down the gas dispenser to increase a width of the plasma in the horizontal direction.

9. The method of claim 6, wherein when an under-etching occurs to the first feature, adjusting the first vertical distance between the gas dispenser and the wafer chuck comprises lowering down the gas dispenser to decrease a width of the plasma in the vertical direction.

10. A method, comprising:
placing a first wafer on a wafer chuck in a chamber of a wafer fabricating system, the wafer fabricating system comprising a gas dispenser in the chamber and above the wafer chuck, and an upper edge ring surrounding the wafer chuck;
producing a first plasma between the wafer chuck and the gas dispenser to form a first feature formed on a central region of the first wafer and a second feature formed on an edge region of the first wafer;
removing the first wafer from the chamber;
measuring a first dimension of the first feature, and measuring a second dimension of the second feature;
calculating a first difference between the first dimension of the first feature and a first predetermined dimension through a process control system, calculating a second difference between the second dimension of the second feature and a second predetermined dimension through the process control system;
placing a second wafer on the wafer chuck;
determining whether the first difference is acceptable through the process control system, and determining whether the second difference is acceptable through the process control system;
in response to the determination determines that the first difference of the central region of the first wafer is not acceptable, adjusting a first vertical distance between the gas dispenser and wafer chuck; in response to the determination determines that the second difference of the edge region of the first wafer is not acceptable, adjusting a second vertical distance between the upper edge ring and the gas dispenser; and after adjusting the first and second vertical distances, producing a second plasma between the wafer chuck and the gas dispenser to form third feature on a central region of the second wafer and a fourth feature on an edge region of the second wafer.

11. The method of claim 10, wherein adjusting the first vertical distance between the gas dispenser and the wafer chuck comprises:
initiating a vertical movement of the gas dispenser relative to the wafer chuck.

12. The method of claim 10, wherein adjusting the second vertical distance between the upper edge ring and the gas dispenser comprises:
adjusting a height of the upper edge ring relative to the wafer chuck.

13. The method of claim 10, wherein the first dimension is a depth of a first recess formed on the central region of the first wafer, and the second dimension is a depth of a second recess formed on the edge region of the first wafer.

14. The method of claim 1, wherein when an over-etching occurs to the first feature on the central region of the first semiconductor wafer, increasing the first vertical distance between the gas dispenser and the wafer chuck.

15. The method of claim 1, wherein when an over-etching occurs to the second feature on the edge region of the first semiconductor wafer, increasing the first vertical distance between the upper edge ring and the gas dispenser.

16. The method of claim 6, wherein the first dimension is a width of a first isolation insulating layer below a first gate structure formed on the central region of the first semiconductor wafer, and the second dimension is a width of a second isolation insulating layer below a second gate structure formed on the edge region of the first semiconductor wafer.

17. The method of claim 6, wherein the first dimension is a width of an isolation insulating layer below a gate structure formed on the central region of the first semiconductor wafer, and the second dimension is a depth of a recess formed on the edge region of the first semiconductor wafer.

18. The method of claim 6, wherein the first dimension is a depth of a recess formed on the central region of the first semiconductor wafer, and the second dimension is a width of an isolation insulating layer below a gate structure formed on the edge region of the first semiconductor wafer.

19. The method of claim 10, wherein the second plasma at a central region of the chamber between the wafer chuck and the gas dispenser has a different plasma density than the first plasma at the central region of the chamber between the wafer chuck and the gas dispenser.

20. The method of claim 10, wherein the second plasma at an edge region of the chamber between the wafer chuck and the gas dispenser has a different plasma density than the first plasma at the edge region of the chamber between the wafer chuck and the gas dispenser.

* * * * *